United States Patent [19]

Habermayr et al.

[11] Patent Number: 5,800,185

[45] Date of Patent: Sep. 1, 1998

[54] ADAPTER WITH A SUPPORT HAVING A CONTACTING DEVICE

[75] Inventors: Erwin Habermayr, Reichertshofen; Dieter Horak, Moosburg, both of Germany

[73] Assignee: Hitex-Systementwicklung, Karlsruhe, Germany

[21] Appl. No.: 688,796

[22] Filed: Jul. 31, 1996

[30] Foreign Application Priority Data

Jul. 31, 1995 [DE] Germany .......................... 195 28 011.3

[51] Int. Cl.⁶ .................................................. H01R 9/09
[52] U.S. Cl. ...................................... 439/72; 439/912
[58] Field of Search ............................ 439/595, 68, 70, 439/72, 73, 74, 912, 40

[56] References Cited

U.S. PATENT DOCUMENTS

| | | | |
|---|---|---|---|
| 4,554,505 | 11/1985 | Zachry | 439/71 |
| 4,843,313 | 6/1989 | Walton | 439/66 |
| 4,940,935 | 7/1990 | Riley | 324/755 |
| 5,036,380 | 7/1991 | Chase | 437/220 |
| 5,313,368 | 5/1994 | Volz et al. | 439/70 |
| 5,453,700 | 9/1995 | Balyasny | 439/912.1 |
| 5,680,057 | 10/1997 | Johnson | 439/68 |

FOREIGN PATENT DOCUMENTS

| | | |
|---|---|---|
| 0 458 448 | 11/1991 | European Pat. Off. . |
| 38 28 148 | 2/1990 | Germany . |
| 43 20 109 | 3/1994 | Germany . |

OTHER PUBLICATIONS

RCA Technical Notes, TN No. 1315, Test Fixture For Testing Chip Carrier Devices, Oct. 1982.

*Primary Examiner*—Gary F. Paumen
*Assistant Examiner*—T. C. Patel
*Attorney, Agent, or Firm*—Evenson, McKeown, Edwards & Lenahan, P.L.L.C.

[57] ABSTRACT

In an adapter with a support having a contacting device for electrically connecting the electrical contacts of an electronic component mounted on a board with a test device, the contacting device is formed by a contact-overlapping electrical connector with grid-shaped lead segments. The support has at least one opening for a releasable mechanical connection with the electronic component or with the board.

2 Claims, 2 Drawing Sheets

ADAPTER WITH A SUPPORT HAVING A CONTACTING DEVICE

BACKGROUND AND SUMMARY OF THE INVENTION

The invention relates to an adapter with a support having a contacting device for electrically connecting electrical contacts of an electronic component mounted on a board with a test device.

Such adapters are known, for example, for connecting test devices, such as logic analyzers or in-circuit emulators, to microprocessors or other integrated circuits that are potted in flat housings (FPGA housings). The "clip-over" adapters usually used for this purpose consist of an adapter board as a support that has a contacting device in the form of one or more bases with electrically conducting spring contacts. This adapter is plugged in from above onto an SMD-soldered electronic component, for example. The spring contacts provided on the adapter firstly create an electrical connection between the contacts (e.g. pins, connecting legs) of the electronic component mounted on a board and a test device, and secondly produce a releasable mechanical connection for fastening the adapter to the electronic component.

The use of spring contacts as a contacting device for the adapter poses both mechanical and electrical problems with increasing miniaturization of electronic components. Firstly, the retaining force of the spring contacts, which are always getting smaller, is no longer sufficient for adequate fastening of the adapter to the component to be tested; secondly, as a result of the difficulty in positioning the adapter due to miniaturization, there is a risk of short circuits occurring between the contacts of the electronic component.

There is therefore needed an improved adapter of the type mentioned above such that short circuits are reliably prevented, even with the increasing miniaturization of electronic components.

These needs are met according to the present invention by an adapter with a support having a contacting device for electrically connecting electrical contacts of an electronic component mounted on a board with a test device. The contacting device is formed by a contact-overlapping electrical connector having grid-shaped lead segments.

According to the invention, the contacting device is formed by a contact-overlapping electrical connector with lead segments in the form of a grid, hereinafter referred to only as the connector.

Such connectors consist, for example, of insulating material that has contact segments arranged in parallel. Plastics could be used for this purpose, for example, into which, or around which, a plurality of thin metal wires arranged in parallel are cast or mounted. In addition, plastics may be used that are arranged in alternately conducting and insulating layers. High-resolution grids in the form of conducting sections arranged in parallel are preferred according to the invention.

The connector is arranged in such fashion that electrically conducting connections are produced between the contacts of the electronic component and the corresponding contact terminals provided on the support for the contacting device. The term "contact-overlapping" is intended to mean that the connector extends over a plurality of, or over all, the electrical contacts located side by side, with the positioning of the contact between the adapter and the electronic component also being facilitated thereby. At the same time, the connector acts as an insulator between the adjacent contacts of the electronic component and/or between the contact terminals of the contacting device.

A connector of this kind can also have devices for mounting the adapter on an electronic component, for example. Thus, a simple short-circuit-proof contact between an adapter and an electronic component is ensured.

One advantageous improvement on the invention provides the support with at least one opening for a releasable mechanical connection with either the electronic component or the board on which the component is mounted.

According to the invention, the support has at least one opening for a releasable mechanical connection with the electronic component or with the board on which the electronic component is mounted.

This permits a stronger fastening device in order to not allow any retaining forces to act on the individual contacts of the electronic component. In addition to providing an easily positionable, short-circuit-free contact, damage caused by fastening the adapter to the electronic component is prevented.

Other objects, advantages and novel features of the present invention will become apparent from the following detailed description of the invention when considered in conjunction with the accompanying drawings.

DETAILED DESCRIPTION OF THE DRAWINGS

Figure 1:
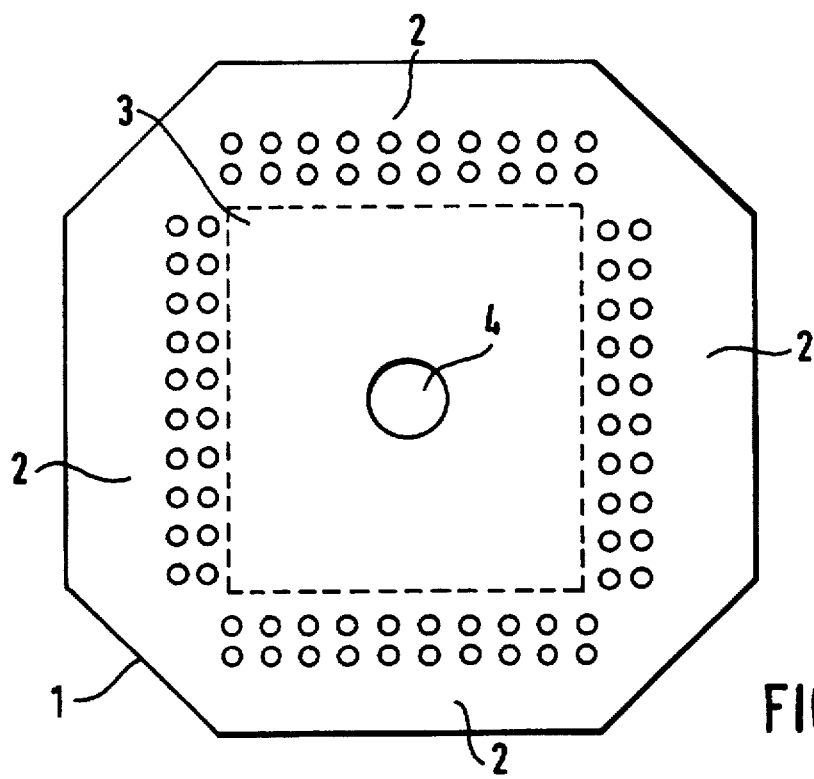
FIG. 1 shows a first embodiment for providing an opening in the support of the adapter.
Figure 2:
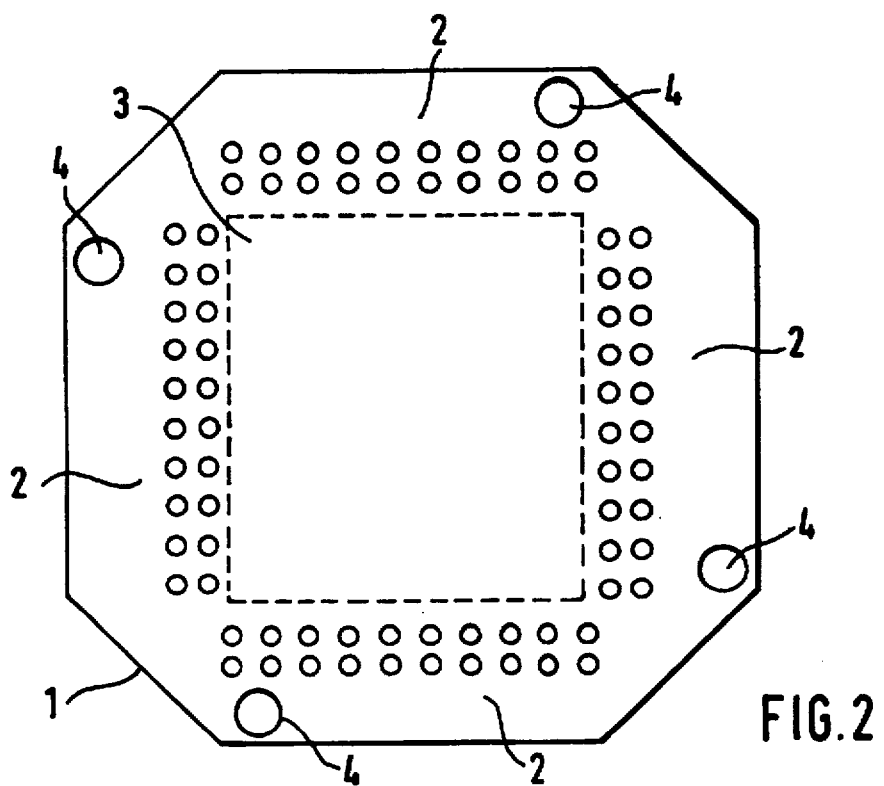
FIG. 2 shows another embodiment for providing openings in the support of the adapter.

FIG. 1 shows an adapter with a support 1 having a contacting device 2. The support is provided, for example, for an electronic component 3 such as a microprocessor. In FIG. 1, opening 4 of support 1 is in the middle of support 1, contacting device 2, and electronic component 3 when the support 1 is already in place on the electronic component 3. FIG. 2 shows an adapter which, in contrast to FIG. 1, has four openings 4 at the edge of the support 1. Since the edge of support 1 extends over the electronic component 3—and over its contacts corresponding to contacting device 2—according to the example in FIG. 2 the support 1 could be fastened by openings 4 to the board on which the component 3 is mounted.

Figure 3:
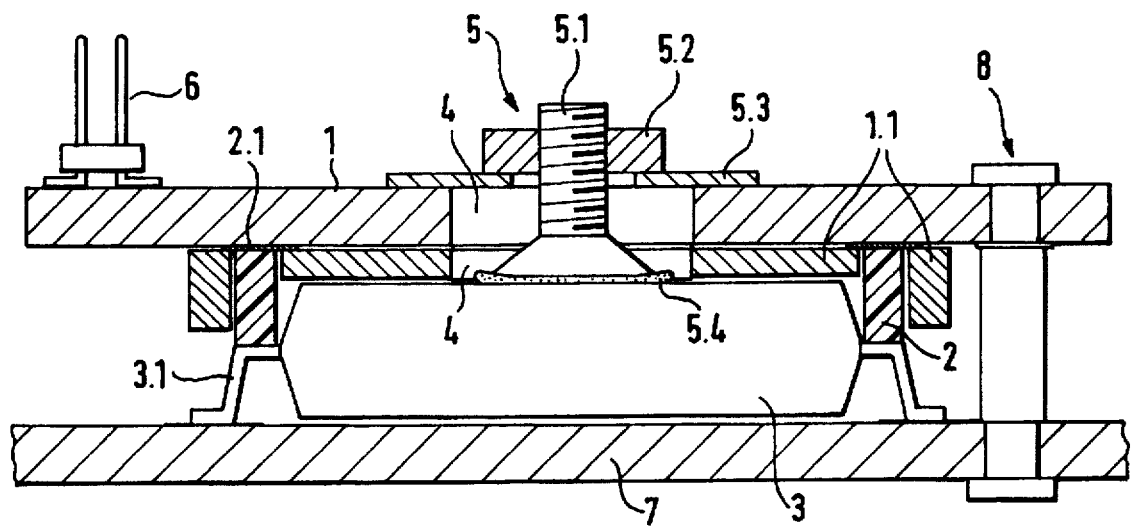
FIG. 3 shows two releasable mechanical connections between an electronic component and an adapter, whose contacting device with lead segments is in the form of a grid in the shape of a plastic strip that conducts in the vertical direction.

FIG. 3 is a cross-sectional side view through the adapter, consisting of support 1 and contacting device 2, through the electronic component 3 on which the adapter is placed, and through the board 7 on which component 3 is mounted.

Support 1 has a base 1.1 by which the contacting device 2 and/or contact-overlapping electrical connector 2 having the grid-shaped lead segments in the form of a plastic strip conducting in one direction is held and is connected with the support 1. Contacting device 2 is connected electrically with plugs 6 which lead to a test device, not shown here.

Connectors 2 which conduct in one direction (vertically in this case) are connected with support 1 in a conducting fashion by contact surfaces 2.1, whose arrangement corresponds to the arrangement of contacts 3.1 of the component 3. Preferably, one connector 2 extends horizontally (FIG. 4) over the entire length of a contact row of contacts 3.1 on one side of the component 3.

Strips of the connectors 2 are placed only on contacts 3.1 of component 3. Contact zones of electrical connector 2, each of which is located between one contact surface 2.1 and one contact 3.1, form the electrically conducting connection. In the horizontal direction, i.e. between individual contacts 3.1 or between individual contact surfaces 2.1, the plastic strip 2, which conducts only in the vertical direction, acts as an insulator. This type of electrical connection is especially favorable for preventing short circuits.

In the support 1 and in the base 1.1 of the support 1, an opening 4 is provided through which a releasable mechanical connection 5 in the form of a screw connection passes. Releasable mechanical connection 5 consists of a screw 5.1 mounted via a releasable adhesive 5.4 on top of the housing of component 3, and of a washer 5.3, and a nut 5.2.

Additionally, a releasable mechanical connection 8 is provided in FIG. 3 between the support 1 of the adapter and the board 7 on which component 3 is mounted.

The mechanical fastening of the adapter and/or support 1 is performed alternatively or additionally to the mechanical connection 5 of the support 1 with the component 3 by the mechanical connection 8 of the support 1 with the board 7. Connection 8, for example, can also be made via a screw connection through the openings in support 1 and board 7 and via a spacing pin placed between the support 1 and the board 7.

Instead of a screw connection, connection 8 can also be provided by a plastic pin with a snap connection, for example. In addition, connection 5, for example instead of being a screw, can be provided by a suction cup adhering to the component 3.

Figure 4:
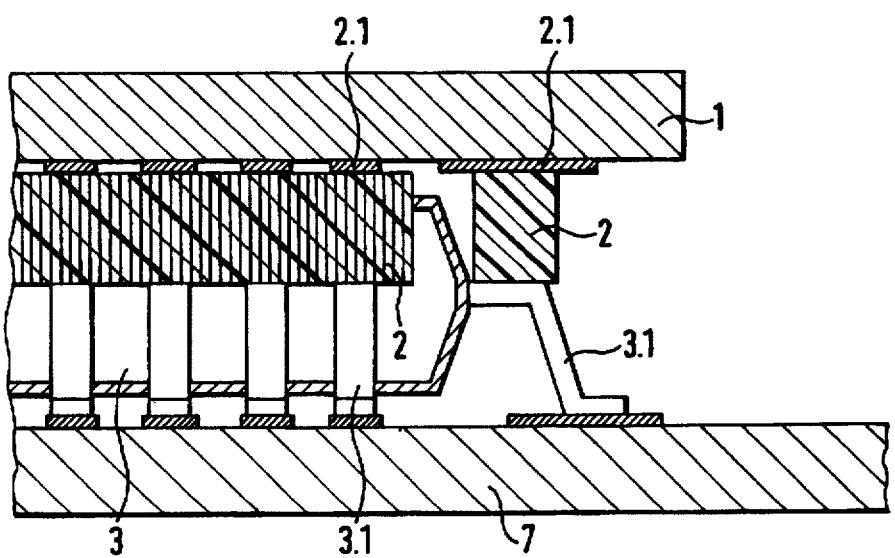
FIG. 4 is an enlarged view of the connector according to the invention.

In FIG. 4, the connector 2 is shown in particular, enlarged as a plastic element 2 that conducts in this case in the vertical direction. FIG. 4 shows a side view of a component 3 with a flat rectangular housing and a row of contacts 3.1 on each side of the housing. Contacts 3.1 are arranged for example to correspond to the contact terminals of contacting device 2 on the adapters shown in FIGS. 1 and 2. The electronic component 3 is mounted on board 7 by contacts 3.1.

The support 1 of the adapter has contact terminals 2.1 corresponding to the contacts 3.1. The contact terminals are in the form of contact surfaces or so-called PADs for example (see also the contact terminals of the contacting device in FIGS. 1 and 2). A contact terminal 2.1 on support 1 is associated with each individual contact 3.1, and a plug 6 (FIG. 3) on top of support 1 is likewise associated with said contact terminals. Plugs 6 are connected with a test device, not shown here. Thus, individual contacts 3.1 are connected by the entire device of the adapter to the test device. The electrical connection between contacts 3.1 and contact terminals 2.1 is created by plastic strips 2 that conduct in one direction. The strips each extend over the rows of contacts on one side of component 3 and are connected permanently in an electrically conducting fashion with contact terminals 2.1 of support 1.

In FIG. 4, the vertical shading of left plastic strip 2 indicates the direction in which the conducting segments act. Plastic strip 2 acts as an insulator between adjacent contacts 3.1 or adjacent contact terminals 2.1, i.e. in the direction perpendicular to the vertical shaded lines. An important requirement for connector 2 for such an application according to the invention is that the resolution of the alternately coated insulating areas and conducting areas of the plastic, in the direction of contacts 3.1 or contact terminals 2.1 to be insulated from one another, be at least twice as high as the intervals between these adjacent contacts 3.1 or contact terminals 2.1. In FIG. 4, left plastic strip 2 is shown with alternately insulating (white) and conducting (black) layers. If one looks at the spaces between the conducting areas shown in black and running in the vertical direction, the resolution of plastic strip 2 relative to the alternately conducting and insulating areas is approximately 4 times higher than the spaces between contacts 3.1 or contact terminals 2.1. The greater the miniaturization of a component, in other words the smaller and closer together contacts 3.1 are, the greater the resolution of the alternately insulating and conducting areas of plastic 2 must be.

It is especially advantageous regarding the embodiment that the plastic that conducts in one direction can extend over a plurality of adjacent contacts in one piece, so that no strict requirements need be imposed regarding the positioning of the contacting device. At the same time, a maximum degree of protection against short circuits is guaranteed.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An adaptor for use with an electrical component having a housing and electrical contacts in order to electrically connect the electrical contacts of the electrical component with a test device, the adaptor comprising:

a support positionable over a top of the housing;

a contact-overlapping electrical connector having grid-shaped lead segments mounted to said support so as to be positionable over the electrical contacts of the electrical component and vertically pressable against substantially horizontal portions of the electrical contacts;

a releasable mechanical connector arranged in the support and attaching directly to the top of the housing; and wherein the adaptor mounts from above the electrical component so as to not have any part below the electrical component.

2. The adaptor according to claim 1, wherein said support has at least one opening in which said releasable mechanical connector is arranged.

* * * * *